United States Patent
Taura

(10) Patent No.: US 9,036,067 B2
(45) Date of Patent: May 19, 2015

(54) SOLID-STATE IMAGING DEVICE INCLUDING A SHIELDING FILM OVER A FLOATING DIFFUSION REGION, FABRICATION METHOD AND ELECTRONIC APPARATUS

(71) Applicant: Sony Corporation, Tokyo (JP)

(72) Inventor: Tadayuki Taura, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/090,935

(22) Filed: Nov. 26, 2013

(65) Prior Publication Data

US 2014/0085520 A1 Mar. 27, 2014

Related U.S. Application Data

(62) Division of application No. 12/711,356, filed on Feb. 24, 2010, now abandoned.

(30) Foreign Application Priority Data

Mar. 5, 2009 (JP) ................................ 2009-052324

(51) Int. Cl.
*H04N 5/335* (2011.01)
*H01L 21/00* (2006.01)
(Continued)

(52) U.S. Cl.
CPC .... *H01L 27/14623* (2013.01); *H01L 27/14609* (2013.01); *H01L 27/14632* (2013.01);
(Continued)

(58) Field of Classification Search
USPC .............. 348/308, 301, 302, 340; 438/69, 70; 257/294
See application file for complete search history.

(56) References Cited

U.S. PATENT DOCUMENTS

| 6,930,299 B2 | 8/2005 | Ohkawa |
| 7,385,167 B2 | 6/2008 | Li et al. |

(Continued)

FOREIGN PATENT DOCUMENTS

| JP | 2004-071931 | 3/2004 |
| JP | 2004-134790 | 4/2004 |

(Continued)

OTHER PUBLICATIONS

Japanese Office Action issued in connection with related Japanese Patent Application No. 2009-052324 dated Jun. 11, 2013.

(Continued)

*Primary Examiner* — John Villecco
(74) *Attorney, Agent, or Firm* — Dentons US LLP

(57) ABSTRACT

A solid-state imaging device includes a photodetector which is formed on a substrate and is configured to generate signal charge by photoelectric conversion, a floating diffusion configured to receive the signal charge generated by the photodetector, a plurality of MOS transistors including a transfer transistor that transfers the signal charge to the floating diffusion and an amplification transistor that outputs an pixel signal corresponding to a potential of the floating diffusion, a multi-wiring layer which is formed in a layer higher than the substrate and is composed of a plurality of wiring layers electrically connected to the MOS transistors via contact portions, and a light-shielding film that is constituted by a bottom wiring layer disposed in a layer higher than the substrate and lower than the multi-wiring layer.

6 Claims, 14 Drawing Sheets

(51) Int. Cl.
  *H01L 31/113* (2006.01)
  *H01L 27/146* (2006.01)
(52) U.S. Cl.
  CPC .... *H01L27/14636* (2013.01); *H01L 27/14689* (2013.01); *H01L 27/14603* (2013.01); *H01L 27/14687* (2013.01); *H01L 27/14638* (2013.01)
  USPC .............................. 348/308; 257/294; 438/69

(56) References Cited

U.S. PATENT DOCUMENTS

| | | | |
|---|---|---|---|
| 7,456,453 | B2 | 11/2008 | Inoue |
| 7,728,268 | B2 | 6/2010 | Sato et al. |
| 8,184,189 | B2 * | 5/2012 | Tamura .......................... 348/308 |
| 2006/0132632 | A1 | 6/2006 | Ihara |
| 2006/0132633 | A1 | 6/2006 | Nam et al. |
| 2006/0231898 | A1 | 10/2006 | Jeong et al. |
| 2007/0012971 | A1 | 1/2007 | Lim |
| 2007/0045665 | A1 | 3/2007 | Park |
| 2009/0021626 | A1 * | 1/2009 | Mori et al. ..................... 348/308 |
| 2009/0303366 | A1 | 12/2009 | Gambino et al. |
| 2014/0084143 | A1 * | 3/2014 | Sakano et al. ................. 257/292 |
| 2014/0104474 | A1 * | 4/2014 | Tange et al. ................... 348/308 |

FOREIGN PATENT DOCUMENTS

| | | |
|---|---|---|
| JP | 2004-140152 | 5/2004 |
| JP | 2006-179713 | 7/2006 |
| JP | 2006-344916 | 12/2006 |

OTHER PUBLICATIONS

European Search Report for EP Application No. 10250193 dated Oct. 23, 2012.
Furumiya, et al., "High Sensitivity and No-Cross-Talk Pixel Technology for Embedded CMOS Image Sensor", Electron Devices Meeting, 2000, IEDM Technical Digest International, Dec. 10, 2000, pp. 701-704.
Chinese Patent Office Action dated Nov. 28, 2014 corresponding to Chinese Serial No. 201110394166.2.

* cited by examiner

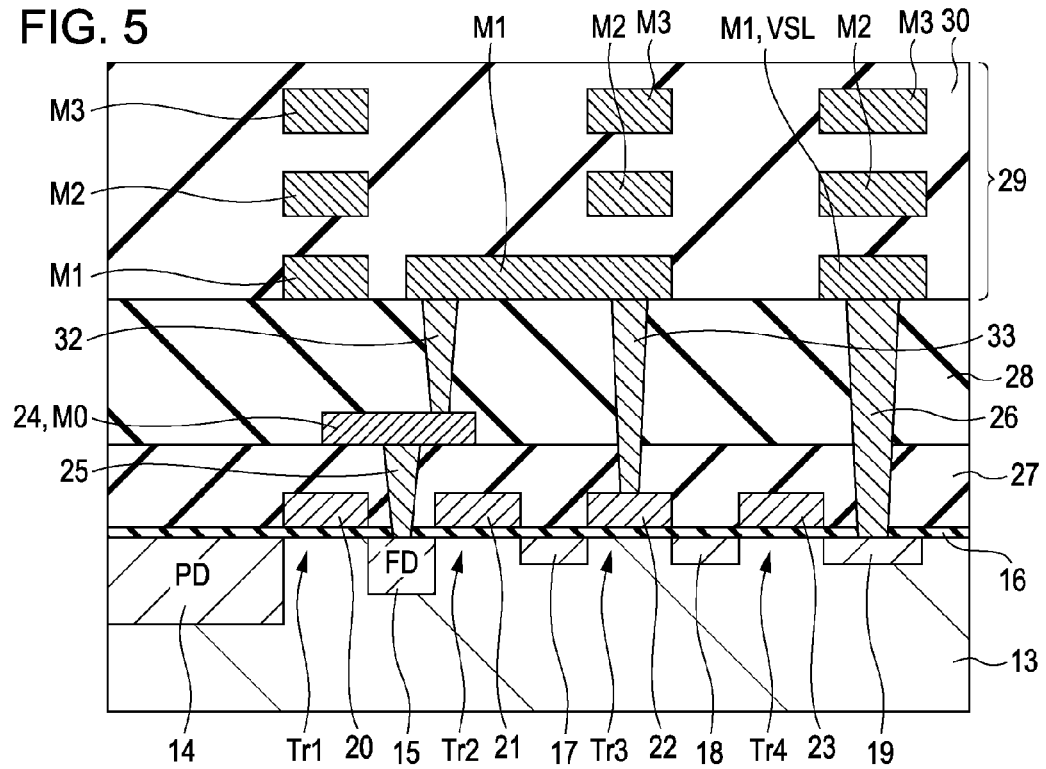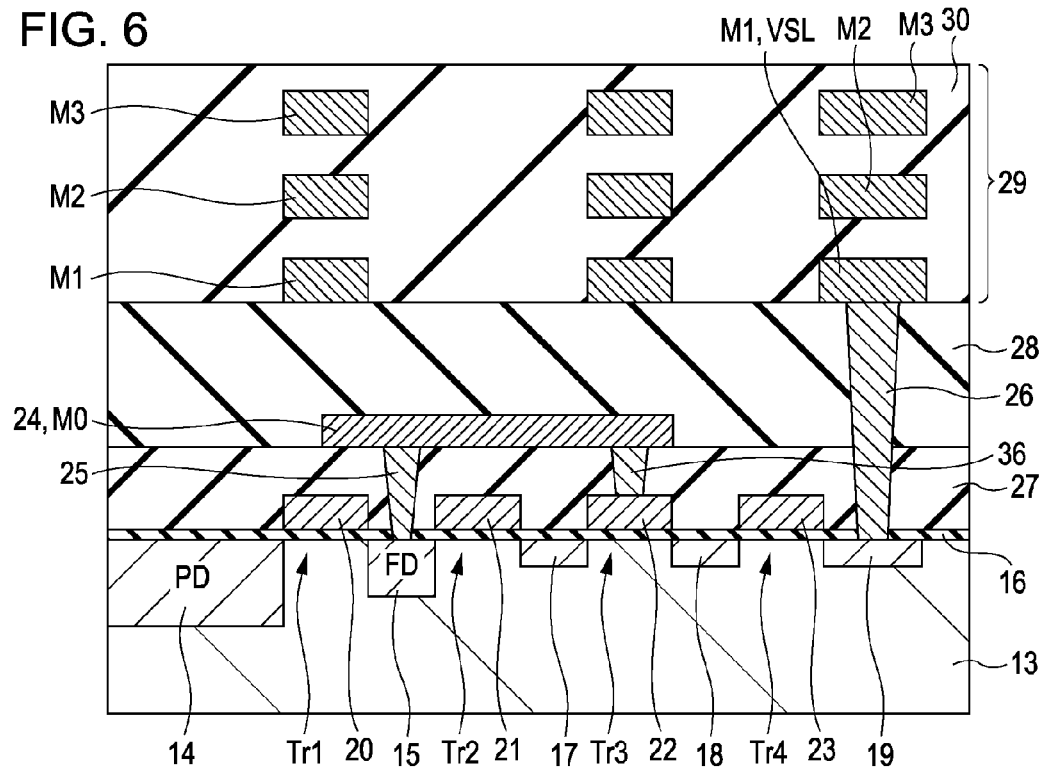

SOLID-STATE IMAGING DEVICE INCLUDING A SHIELDING FILM OVER A FLOATING DIFFUSION REGION, FABRICATION METHOD AND ELECTRONIC APPARATUS

RELATED APPLICATION DATA

This application is a division of U.S. patent application Ser. No. 12/711,356 filed on Feb. 24, 2010, the entirety of which is incorporated herein by reference to the extent permitted by law. The present application claims the benefit of priority to Japanese Patent Application No. JP 2009-052324 filed on Mar. 5, 2009 in the Japan Patent Office, the entirety of which is incorporated by reference herein to the extent permitted by law.

BACKGROUND OF THE INVENTION

1. Field of the Invention

The present invention relates to solid-state imaging devices. In particular, the present invention relates to CMOS solid-state imaging devices which transfer signal charge to floating diffusions, and methods for fabricating the solid-state imaging devices. The present invention also relates to electronic apparatuses employing the solid-state imaging devices.

2. Description of the Related Art

Solid-state imaging devices are generally classified into CCD (charge coupled devices) solid-state imaging devices and CMOS (complementary metal oxide semiconductor) solid-state imaging devices. In a CCD solid-state imaging device, a high drive voltage is necessary to transfer signal charge, and a high supply voltage is necessary compared to a CMOS solid-state imaging device. Thus, CMOS solid-state imaging devices are more advantageous than CCD solid-state imaging devices in view of power consumption.

Thus, CMOS solid-state imaging devices, which are more advantageous than CMOS solid-state imaging devices, have been in wide use as solid-state imaging devices for mobile apparatuses such as mobile phones equipped with cameras and PDAs (personal digital assistants).

A CMOS solid-state imaging device includes a photodiode and is composed of a photodetector for generating signal charge upon receiving light, a floating diffusion receiving the signal charge generated by the photodetector, and a plurality of MOS transistors. The MOS transistors include a transfer transistor, a reset transistor, an amplification transistor, and, as necessary, a selection transistor. These MOS transistors are connected predetermined wiring layers in a multi-wiring layer. In the CMOS solid-state imaging device, signal charge generated and accumulated in the photodetector is transferred by the transfer transistor to the floating diffusion on a pixel by pixel basis. The signal charge read by the floating diffusion is amplified by the amplification transistor and selectively output to a one of vertical signal lines formed in the multi-wiring layer.

Meanwhile, in such a CMOS solid-state imaging device, a larger aperture above a photodiode serving as a photodetector is more desirable to efficiently collect light incident onto the photodiode.

On the other hand, photoelectric conversion also occurs in the floating diffusion if it receives light while reading signal charge transferred from the photodetector, which results in noise. Therefore, it is desirable that the floating diffusion is shielded from light.

In a CMOS solid-state imaging device according to the related art, a floating diffusion is shielded from light using a multi-wiring layer disposed above the substrate. However, since pixels are formed using CMOS processes as in the case of the other peripheral circuits, the wiring layers may not be disposed so as to be immediately above the floating diffusion, as compared to the case of a CCD solid-state imaging device. Thus, it is not possible to decrease the distance between the wiring layers constituting a light-shielding film and a floating diffusion and to prevent light leakage into the floating diffusion.

In view of the above problem, Japanese Unexamined Patent Application Publication No. 2004-140152 discloses a CMOS solid-state imaging device in which a light-shield is formed using a multilayer gate electrode film. In this technique, since the light-shield is arranged immediately above the floating diffusion, leakage of light into the floating diffusion may be suppressed. However, to form the gate electrode film in a multilayer structure, the gate electrode film is made of silicide, which leads to complicated fabrication processes. In addition, it is difficult to form a small aperture for a contact region due to unevenness of the gate electrode. Thus, it is necessary for a floating diffusion to have a large area in order to form the contact region. Moreover, interference between the gate electrode layers due to a large parasitic capacitance between the gate electrode layers is also a matter of concern.

Japanese Unexamined Patent Application Publication No. 2004-71931 discloses a technique in which gate electrodes of a floating diffusion and an amplification transistor are electrically connected without wiring. This increases the degree of freedom in layout of wiring layers and thus makes it possible to increase the size of the aperture of the photodetector. However, according to Japanese Unexamined Patent Application Publication No. 2004-71931, a floating diffusion is shielded from light using a wire arranged in a multi-wiring layer disposed in an upper layer. This allows light to travel between the light-shielding film and the floating diffusion, resulting in insufficient light shielding performance.

SUMMARY OF THE INVENTION

The present invention has been made in view of the above circumstances. Accordingly, there is a need for a solid-state imaging device which efficiently shields a floating diffusion from light and thus provides images with improved quality. There is also a need for an electronic apparatus using the solid-state imaging device.

It is desirable that a solid-state imaging device according to an embodiment of the present invention includes a photodetector, a floating diffusion, a plurality of MOS transistors, a multi-wiring layer, and a light-shielding film.

The photodetector is formed on a substrate and generates signal charge by converting incident light into electricity. The floating diffusion is configured to receive the signal charge generated by the photodetector. The MOS transistors include a transfer transistor that transfers the signal charge to the floating diffusion and an amplification transistor that outputs a pixel signal corresponding to a potential of the floating diffusion. The multi-wiring layer is formed in a layer higher than the substrate and is composed of a plurality of wiring layers electrically connected to the MOS transistors via contact portions. The light-shielding film is constituted by a bottom wiring layer disposed in a layer higher than the substrate and lower than the multi-wiring layer. The light shielding film is formed at a region that shields at least the floating diffusion from the light and is electrically connected to the floating diffusion via a contact portion.

In a solid-state imaging device according to an embodiment of the present invention, the floating diffusion is shielded from light by the light-shielding film constituted by the bottom wiring layer. The bottom wiring layer is disposed at a position lower than the multi-wiring layer and close to the upper surface of the substrate. Thus, the light-shielding film constituted by the bottom wiring layer can prevent leakage of light into the floating diffusion.

In a method for fabricating a solid-state imaging device according to an embodiment of the present invention, a photodetector and a floating diffusion are first formed on a substrate. Then, a first insulating layer is formed on the substrate. Then, an aperture is formed in the first insulating layer so that the floating diffusion is exposed. Subsequently, a contact portion is formed by filling the aperture with a metallic material. Then, a light-shielding film constituted by a bottom wiring layer is formed on the first insulating layer including the contact portion, at a region that shields the floating diffusion from light. Further, a second insulating layer is formed on the first insulating layer including the light-shielding film. Then, a multi-wiring layer having a plurality of wiring layers is formed on the second insulating layer.

In a method for fabricating a solid-state imaging device according to an embodiment of the present invention, a photodetector, a floating diffusion, and an impurity region constituting a predetermined source or drain of a MOS transistor are first formed on a substrate. Then, apertures for exposing the floating diffusion and the impurity region are formed by removing respective portions of the first insulating layer above the floating diffusion and the impurity region. Then, contact portions are formed by filling the apertures formed in the first insulating layer with a metallic material. Subsequently, a light-shielding layer constituted by a bottom wiring layer is formed on the first insulating layer including the contact portion formed on the floating diffusion, at a region shielding the floating diffusion from the light. Further an intermediate film constituted by the bottom wiring layer is formed on the first insulating layer including the contact portion formed on the impurity region. Then, a second insulating layer is formed on the first insulating layer including the light-shielding film and the intermediate film. Subsequently, an aperture is formed in the second insulating layer so that the intermediate film is exposed. Then, a contact portion is formed by filling the aperture formed in the second insulating layer with a metallic material. Further, a multi-wiring layer having a plurality of wiring layers including a wire connected to the contact portion formed in the second insulating layer is formed.

An electronic apparatus according to an embodiment of the present invention includes an optical lens, the solid-state imaging device described above, and a signal processing circuit.

According to an embodiment of the present invention, there is provided for a solid-state imaging device which suppresses degradation of image quality caused by noise and for an electronic apparatus using the solid-state imaging device.

BRIEF DESCRIPTION OF THE DRAWINGS

FIG. 5 is a cross-sectional view illustrating an example of electrical connection between a light-shielding film and a gate electrode;

FIG. 6 is a cross-sectional view illustrating another example of electrical connection between a light-shielding film and a gate electrode;

DESCRIPTION OF THE PREFERRED EMBODIMENTS

Figure 1:
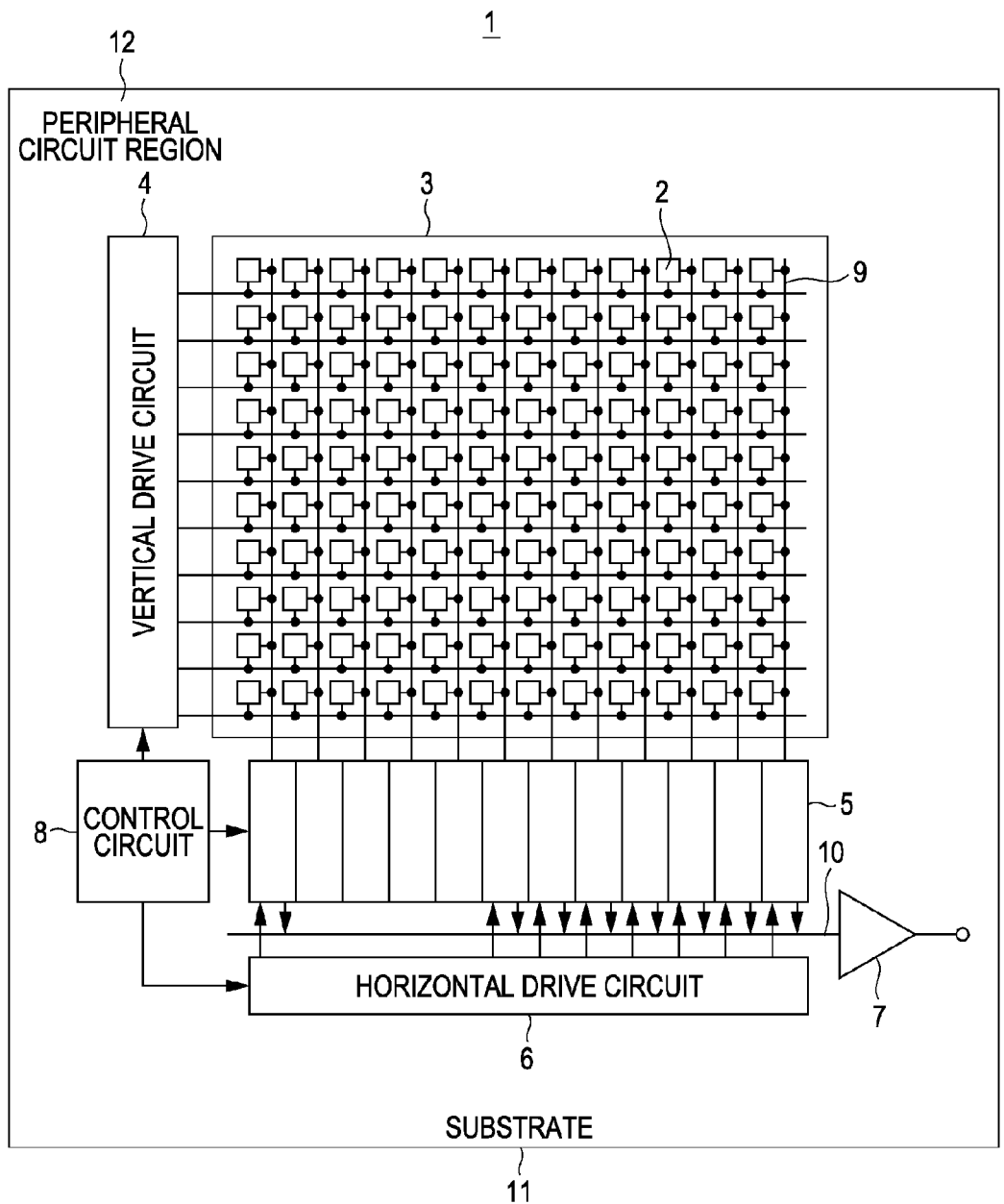
FIG. 1 schematically illustrates an entire structure of a solid-state imaging device according to a first embodiment of the present invention.

In the following, examples of a solid-state imaging device, a method for fabricating the solid-state imaging device, and an electronic apparatus according to embodiments of the present invention will be described with reference to FIG. 1 to FIG. 16. The preferred embodiments of the present invention will be described in the following sequence. Note that the present invention is not limited to the examples described below.

1. First Embodiment: Solid-state imaging device
   1.1 Overall configuration of solid-state imaging device
   1.2 Configurations of main components
   1.3 Fabrication method of solid-state imaging device
2. Second Embodiment: Solid-state imaging device
3. Third Embodiment: Solid-state imaging device
   3.1 Configurations of main components
   3.2 Fabrication method of solid-state imaging device
4. Fourth Embodiment: Solid-state imaging device
5. Fifth Embodiment: Electronic apparatus 1. First Embodiment: Solid-State Imaging Device

[1.1 Overall Configuration of Solid-State Imaging Device]

FIG. 1 is a block diagram schematically illustrating an overall configuration of a solid-state imaging device according to the first embodiment of the present invention.

A solid-state imaging device 1 according to the present embodiment includes a pixel section 3 composed of a plurality of pixels 2 arranged on a substrate 11 formed of silicon, a vertical drive circuit 4, column signal processing circuits 5, a horizontal drive circuit 6, an output circuit 7, and a control circuit 8.

The pixels 2 are each composed of a photodetector composed of a photodiode and a plurality of MOS (metal oxide semiconductor) transistors and are arranged in a regular two-dimensional array on the substrate 11. The MOS transistors constituting the pixels 2 may be composed of four MOS transistors including a transfer transistor, a reset transistor, a selection transistor, and an amplification transistor. The MOS transistors may also be constituted by the tree of the four MOS transistors (excluding the selection transistor).

The pixel section 3 is composed of the pixels 2 arranged in a regular two-dimensional array. The pixel section 3 includes an effective pixel region and a black reference pixel region (not shown). The effective pixel region serves to receive light, amplify signal charge generated by photoelectric conversion, and transfer the signal charge to the column signal processing circuit 5. The black reference pixel region serves to output optical black level as a reference black level. In general, such a black reference pixel region is provided around a circumferential periphery of the effective pixel region.

The control circuit 8 generates signals, such as clock signals and control signals, for controlling operations of the vertical drive circuit 4, the column signal processing circuits 5, and the horizontal drive circuit 6, on the basis of vertical synchronization signals, horizontal synchronization signals, and master clock signals. The signals generated by the control circuit 8 are input to the vertical drive circuit 4, the column signal processing circuit 5, the horizontal drive circuit 6, and so forth.

The vertical drive circuit 4 is composed of a shift register, for example, and selectively scans the pixels 2 in the pixel section 3 in the vertical direction sequentially in units of rows. Then, the vertical drive circuit 4 supplies pixel signals to the column signal processing circuits 5 through vertical signal lines. The pixel signals are generated on the basis of signal charge generated in the individual photodiodes of the pixels 2 in accordance with the quantity of received light.

The column signal processing circuits 5 are provided for the individual column of the pixels 2. Each of the column signal processing circuits 5 performs signal processing, such as noise reduction and signal amplification, on signals output from the pixels 2 corresponding to a single row in units of columns, using signals from the black reference pixel region (provided around a circumference periphery of the effective pixel region (not shown)). A horizontal selection switch (not shown) is provided between the output stage of the column signal processing circuits 5 and a horizontal signal line 10.

The horizontal drive circuit 6 is composed of a shift register, for example. The horizontal drive circuit 6 sequentially selects the column signal processing circuits 5 to cause the individual column signal processing circuits 5 to output pixel signals to the horizontal signal line 10.

The output circuit 7 performs signal processing on signals sequentially supplied from the individual column signal processing circuits 5 through the horizontal signal line 10 and outputs the processed signals.

[1.2 Configurations of Main Components]

Figure 2:
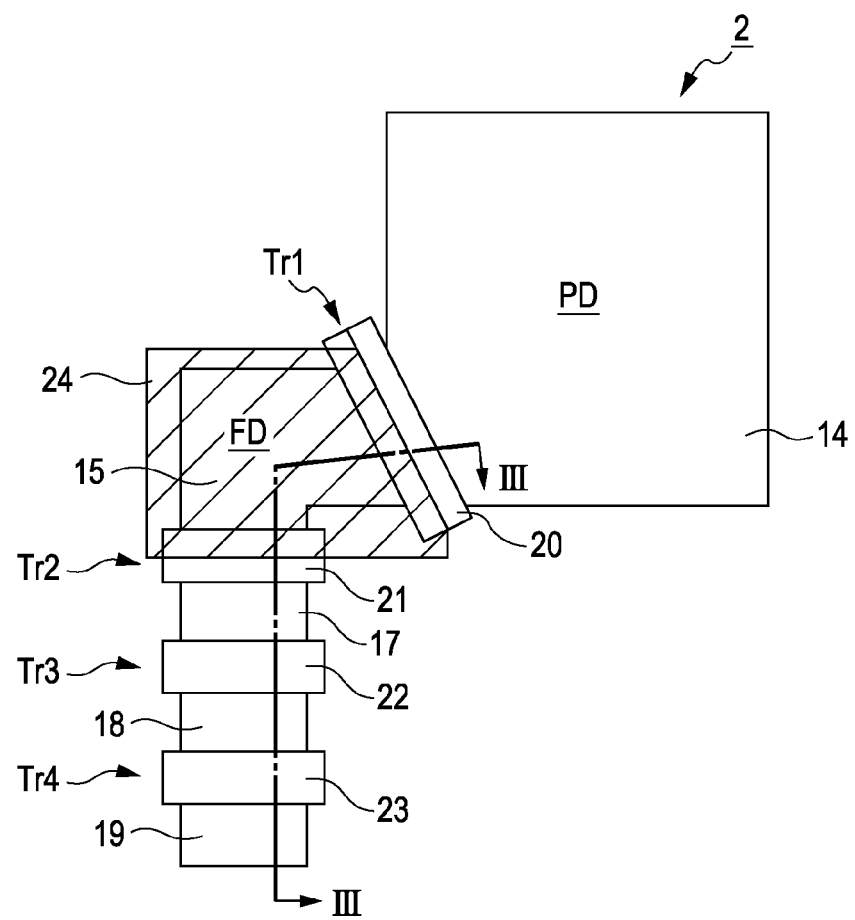
FIG. 2 is a plan view illustrating a single pixel in a solid-state imaging device according to the first embodiment of the present invention.
Figure 3:
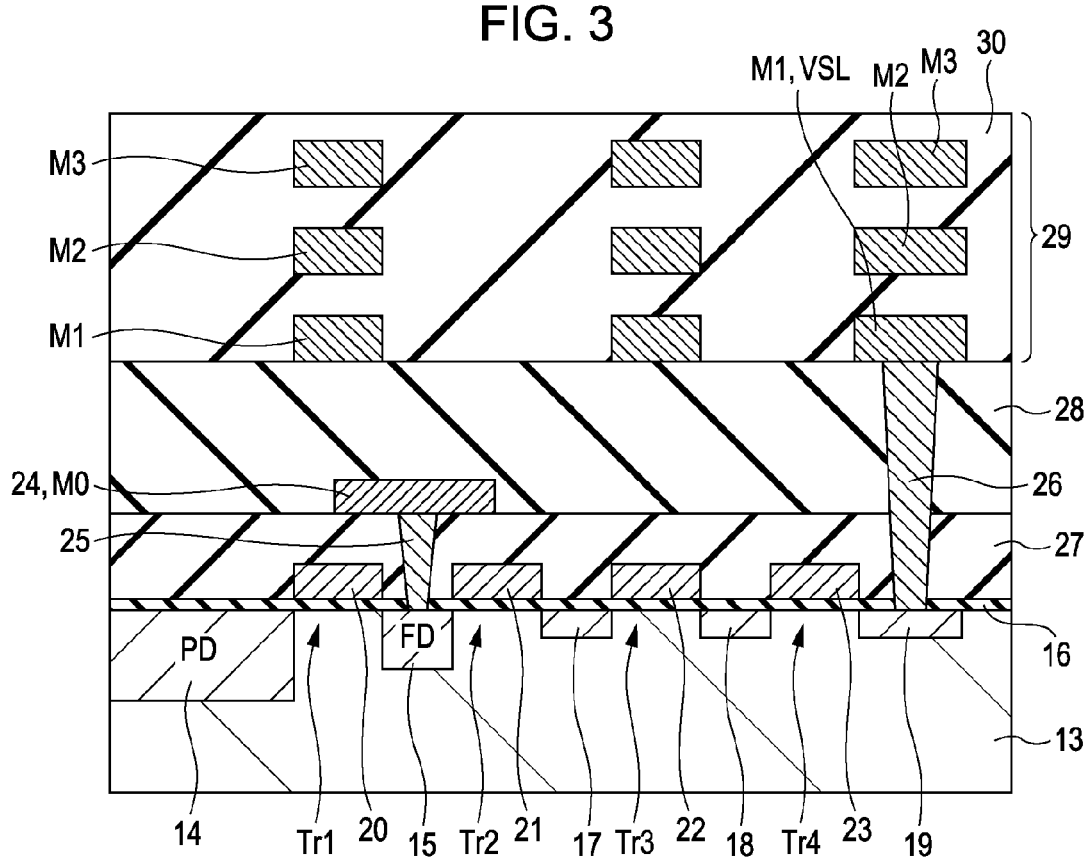
FIG. 3 is a cross sectional view taken along line III-III'.
Figure 4:
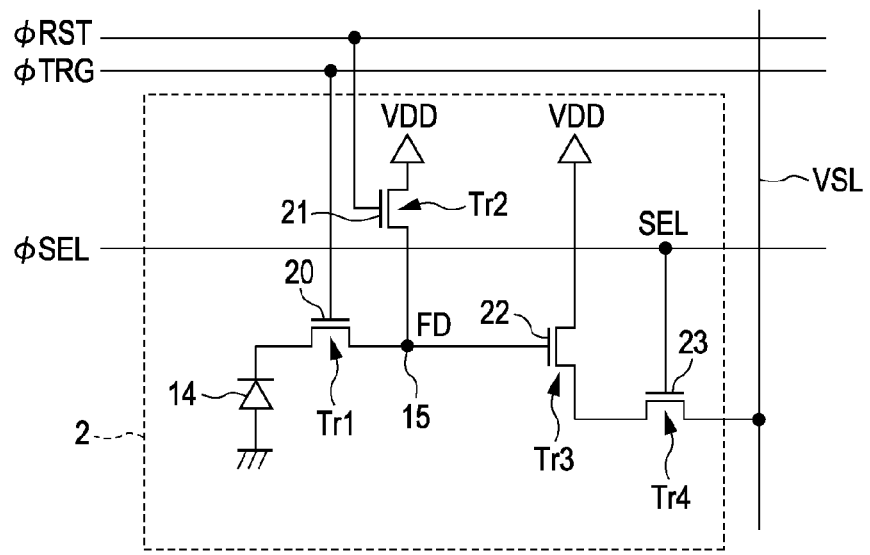
FIG. 4 illustrates a circuit configuration of a single pixel in a solid-state imaging device according to the first embodiment of the present invention.

In the following, schematic configurations of main components of a solid-state imaging device according to the present embodiment will be described with reference to FIG. 2 to FIG. 4. FIG. 2 is a plan view illustrating a single pixel in the solid-state imaging device 1 according to the present embodiment. FIG. 3 is a cross-sectional view taken along line III-III' in FIG. 2. FIG. 4 illustrates a circuit configuration corresponding to a single pixel in the solid-state imaging device 1 according to the present embodiment.

Referring to FIG. 2, each of the pixels 2 according to the present embodiment has a photodetector 14, a floating diffusion 15, and a plurality of MOS transistors. In the present embodiment, the MOS transistors include a transfer transistor Tr1, a reset transistor Tr2, an amplification transistor Tr3, and a selection transistor Tr4. In the present embodiment, a light-shielding film 24 for covering the floating diffusion 15 is provided above the floating diffusion 15.

As illustrated in FIG. 3, the photodetector 14 is formed of a photodiode disposed at a predetermined position on the upper surface of a substrate 13 made of silicon. The photodetector 14 generates signal charge corresponding to the quantity of incident light and accumulates the signal charge.

The floating diffusion 15 is disposed on the upper surface of the substrate 13 at a position adjacent the photodetector 14. The region between the photodetector 14 and the floating diffusion 15 serves as a channel region of the transfer transistor Tr1.

The photodetector 14 also includes impurity regions 17, 18, and 19 forming source/drain regions of the MOS transistors, which will be described below, at predetermined positions on the upper surface of the substrate 13 serving as a light incident surface. Gate electrodes 20, 21, 22, and 23 are also disposed on the substrate 13 via a gate insulating film 16.

The transfer transistor Tr1 includes a source constituted by the photodetector 14, a drain constituted by the floating diffusion 15, and the gate electrode 20 formed between the source and the drain. As illustrated in FIG. 4, a transfer pulse φTRG is supplied to the gate electrode 20 of the transfer transistor Tr1. As a result, signal charge accumulated in the photodiode 14 is transferred to the floating diffusion 15.

The reset transistor Tr2 has a source constituted by the floating diffusion 15, a drain constituted by the impurity region 17 to which a supply voltage VDD is supplied, and the gate electrode 21 formed between the source and the drain. As illustrated in FIG. 4, a reset pulse φRST is supplied to the gate electrode 21 of the reset transistor Tr2. This causes the potential of the floating diffusion 15 to be reset to a potential that approximates the supply voltage VDD.

The amplification transistor Tr3 includes a source constituted by the impurity region 17 to which the supply voltage VDD is supplied, a drain constituted by the impurity region 18 and the gate electrode 22 formed between the source and the drain. As illustrated in FIG. 4, the potential of the floating diffusion 15 is supplied to the gate electrode 22 of the amplification transistor Tr3. This causes a pixel signal corresponding to the potential to be output to the impurity region 18 serving as the drain.

The selection transistor Tr4 includes a source constituted by the impurity region 18, a drain constituted by the impurity region 19 connected to a vertical signal line VSL, and the gate electrode 23 formed between the source and the drain. The impurity region 18 serving as the source of the selection transistor Tr4 is also used as the drain of the amplification transistor Tr3. As illustrated in FIG. 4, a selection pulse φSEL is supplied to the gate electrode 23 of the selection transistor Tr4. As a result, a pixel signal is output to the vertical signal line VSL.

As illustrated in FIG. 3, a first insulating layer 27 is formed on the gate insulating film 16 including the gate electrodes 21 to 23. A light-shielding film 24 constituted by a bottom wiring layer M0 is disposed on the first insulating layer 27 at a region above the floating diffusion 15. This light-shielding film 24 (bottom wiring layer M0) is made of a metal and is electrically connected to the floating diffusion 15 by a contact portion 25 formed in the floating diffusion 15. In the present embodiment, a metal used for forming the contact portion 25 and the light-shielding film 24 may be tungsten, for example. For the bottom wiring layer M0, a metal such as tungsten, aluminum, and copper may be used. In particular, the use of tungsten for the bottom wiring layer M0, which is the same material as that generally used for contact portions, increases reliability in manufacturing processes.

Further, a second insulating layer 28 is formed on the first insulating layer 27 including the light-shielding film 24. A multi-wiring layer 29 is formed on the second insulating layer 28. In the multi-wiring layer 29, a plurality of wiring layers are formed with an interlayer insulating film therebetween. In the present embodiment, three wiring layers M1, M2, and M3 are provided. The wiring layer M1, which is located at the lowest position among the three wiring layers M1 to M3, constitutes a vertical signal line VSL. This vertical signal line VSL is electrically connected to the impurity region 19 constituting the selection transistor Tr4 via a contact portion 26 formed through the second insulating layer 28, the first insulating layer 27, and the gate insulating film 16. The individual wiring layers M1, M2, and M3 in the multi-wiring layer 29 are connected to the gate electrodes 20, 21, 22, and 23, and the like via contact portions (not shown), so as to be used as wires for supplying pulse signals as necessary. The wiring layers M1, M2, and M3 are preferably formed of a low-resistance metal such as aluminum and copper. The contact portion 26 may be formed of tungsten.

As described above, in the solid-state imaging device 1 according to the present embodiment, the light-shielding film 24 shielding the floating diffusion 15 from light is made of a metal formed in a layer higher than the substrate 13 and lower than the multi-wiring layer 29.

Meanwhile, it is necessary that the floating diffusion 15 and the gate electrode 22 be electrically connected to each other.

FIG. 5 is a cross-sectional view illustrating an example of an electrical connection between the light-shielding film 24 and the gate electrode 22.

In this example, the floating diffusion 15 is connected to the gate electrode 22 of the amplification transistor Tr3 using the wiring layer M1, which is disposed at the lowest position among the wiring layers M1, M2, and M3 in the multi-wiring layer 29. In this case, as shown in FIG. 5, the light-shielding film 24 is electrically connected to the wiring layer M1 via a contact portion 32, and the gate electrode 22 is electrically connected to the wiring layer M1 via a contact portion 33, so that the floating diffusion 15 and the gate electrode 22 are electrically connected to each other.

Another example of an electrical connection between the light-shielding film 24 and the gate electrode 22 is illustrated in FIG. 6.

In this example, the light-shielding film 24 is used as a wire for connecting the floating diffusion 15 and the gate electrode 22. In this case, as shown in FIG. 6, the light-shielding film 24 extends above the gate electrode 22 of the amplification transistor Tr3 and is connected to the gate electrode 22 via a contact portion 36. With this arrangement, the floating diffusion 15 and the gate electrode 22 are electrically connected to each other. In the present embodiment, the light-shielding film 24 is formed of a metal, so as to also be used as a wire connecting the floating diffusion 15 and the gate electrode 22. This can decrease the size of a region occupied by the wiring layer M1, compared to the case illustrated in FIG. 5, and thus can increase the size of the aperture of the photodetector 14.

In the solid-state imaging device 1 having the above configuration, signal charge accumulated in the photodetector 14 is transferred by the transfer transistor Tr1 to the floating diffusion 15. The signal charge read by the floating diffusion 15 is amplified by the amplification transistor Tr3 and selectively transferred by the selection transistor Tr4 to a vertical signal line VSL. The signal charge read by the floating diffusion 15 is reset by the reset transistor Tr2 to a potential that approximates the supply voltage VDD.

[1.3 Fabrication Method of Solid-State Imaging Device]

In the following, a method for fabricating the solid-state imaging device according to the present embodiment will be described with reference to FIG. 7A to FIG. 9H. FIG. 7A to FIG. 9C illustrate processes in the fabrication method of the solid-state imaging device 1 according to the present embodiment.

Figure 7A:
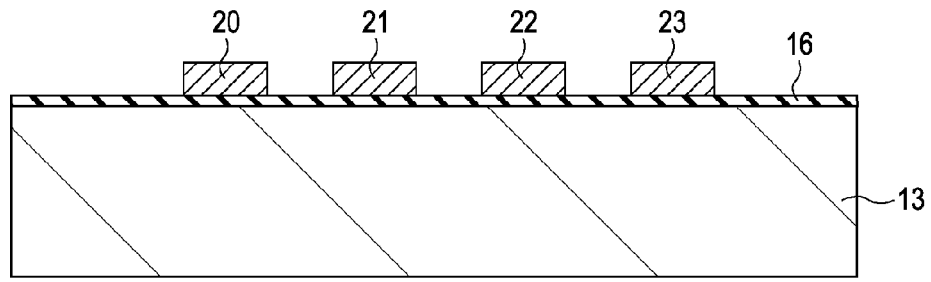
FIGS. 7A to 7C illustrate processes of fabricating a solid-state imaging device according to the first embodiment of the present invention.

Firstly, the upper surface, or light-incident surface, of the silicon substrate 13 is doped with a predetermined conductive impurity by ion implantation. As a result, as illustrated in FIG. 7A, the gate insulating film 16 is formed on the substrate 13, and gate electrodes 20, 21, 22, and 23 are formed at predetermined positions on the gate insulating film 16. These gate electrodes 20, 21, 22, and 23 are formed by patterning a polysilicon film deposited on the gate insulating film 16.

Figure 7B:
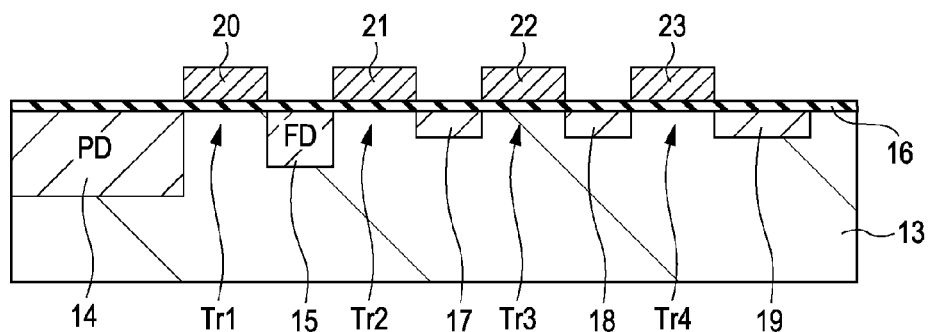

Then, as illustrated in FIG. 7B, using the gate electrodes 20 to 23 as masks, the photodetector 14, the floating diffusion 15, and impurity regions 17, 18, and 19 serving as the sources and drains of the individual MOS transistors are formed.

Figure 7C:
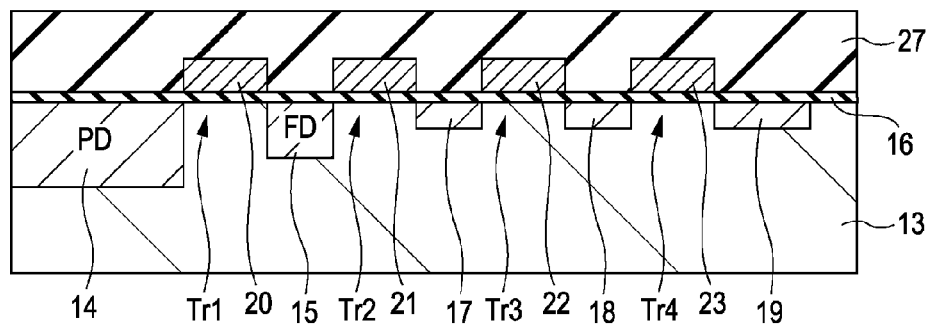

Then, as illustrated in FIG. 7C, the first insulating layer 27 is formed on the upper surface of gate insulating film 16 including the gate electrodes 20 to 23.

Figure 8D:
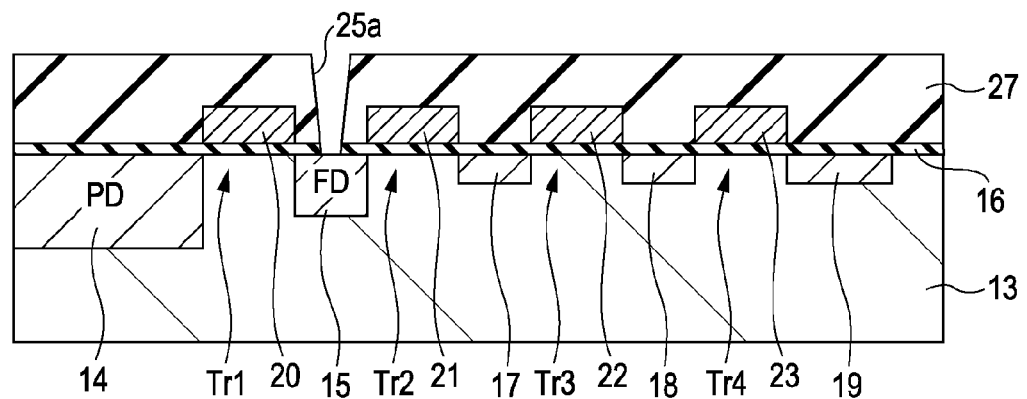
FIGS. 8D and 8E illustrate processes of fabricating a solid-state imaging device according to the first embodiment of the present invention.

Subsequently, as illustrated in FIG. 8D, an aperture 25a is formed through the gate insulating film 16 and the first insulating layer 27 so that the floating diffusion 15 is exposed.

Figure 8E:
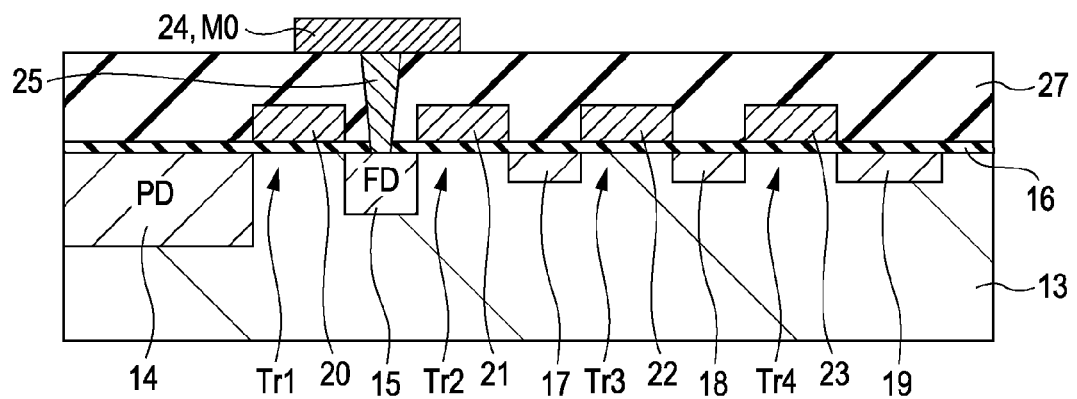

Then, as illustrated in FIG. 8E, the aperture 25a is filled with tungsten so as to form the contact portion 25. Then, the bottom wiring layer M0 made of tungsten is disposed on the first insulating layer 27 so as to be located above the floating diffusion 15. This bottom wiring layer M0 constitutes the light-shielding film 24. A metal film formed of tungsten is formed over the entire upper surface of the first insulating layer 27, and then the light-shielding film 24 is formed by patterning the tungsten metal film. It is desirable that the region occupied by the light-shielding film 24 on the first insulating layer 27 is larger than the upper surface of the floating diffusion 15. This arrangement improves the light shielding effect for light incident from various angles.

Figure 9F:
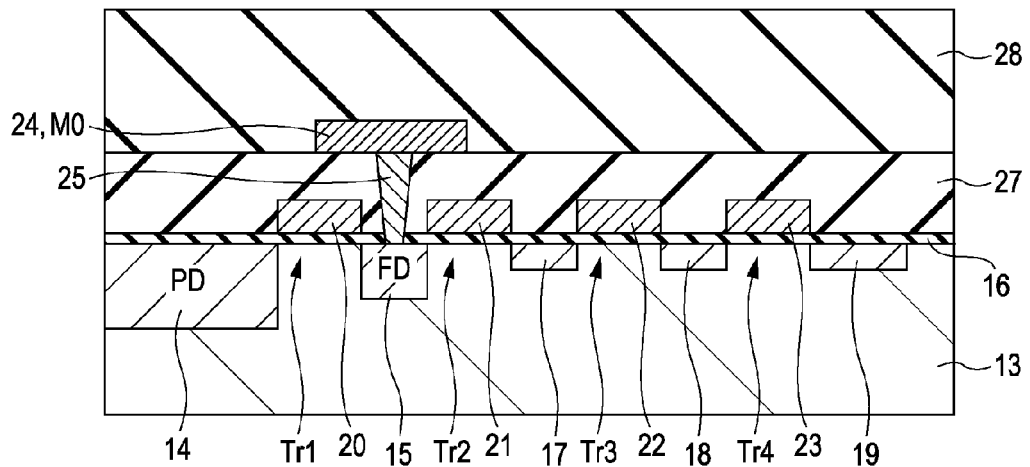
FIGS. 9F to 9H illustrate processes of fabricating a solid-state imaging device according to the first embodiment of the present invention.

Subsequently, as illustrated in FIG. 9F, the second insulating layer 28 is formed on the first insulating layer 27 including the light-shielding film 24.

Figure 9G:
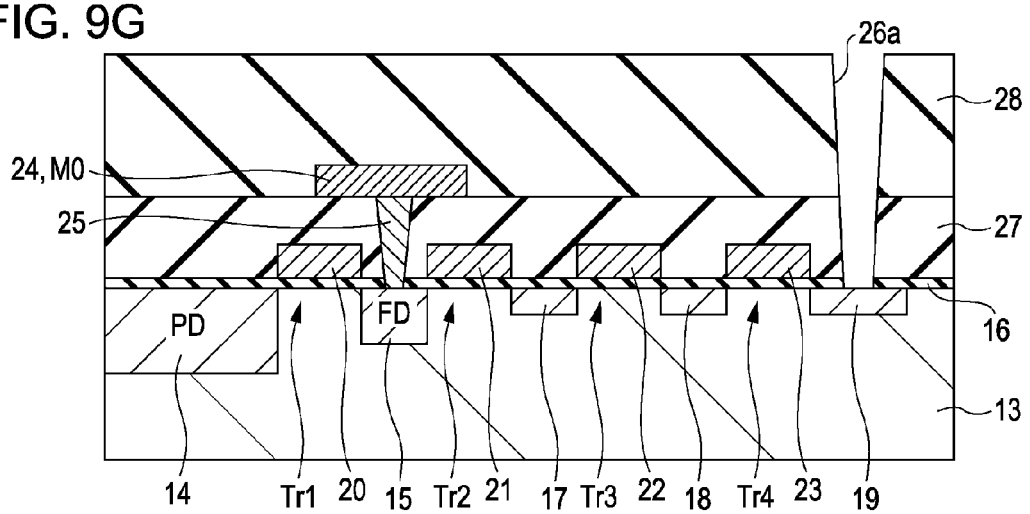

Then, as illustrated in FIG. 9G, an opening 26a for providing the contact portion 26 is formed at a predetermined position of the second insulating layer 28. In the present embodiment, the opening 26a penetrates the second insulating layer 28, the first insulating layer 27, and the gate insulating film 16, such that the impurity region 19 serving as the drain of the selection transistor Tr4 is exposed.

Figure 9H:
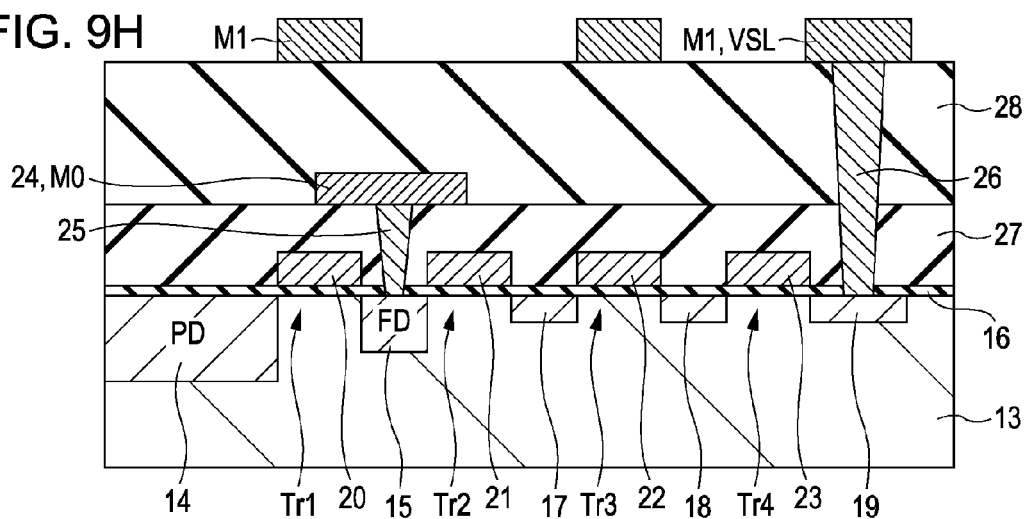

Then, as illustrated in FIG. 9H, the opening 26a is filled with tungsten so as to form the contact region 26.

Although not illustrated in the drawings, the wiring layer M1 formed of aluminum or copper is disposed at a region including the contact portion 26 on the second insulating layer 28. This process is followed by processes of forming the wiring layers M2 and M3 with the interlayer insulating film 30 therebetween so as to form the multi-wiring layer 29 having the three wiring layers M1, M2, and M3. It is desirable that the wiring layers M1 to M3 have low resistance and be made of aluminum or copper.

Subsequently, using a general fabrication method of solid-state imaging devices, a planarizing layer, a color filter layer, an on-chip microlens, and so forth are formed, and thus the fabrication of the solid-state imaging device 1 is completed.

In the fabrication method described above, when the floating diffusion 15 is desired to be connected to the gate electrode 22 of the amplification transistor Tr3 using the wiring layer M1 as in the case illustrated in FIG. 5, the contact portions 32 and 33 are formed in the processes illustrated in FIGS. 9G and 9H. Then, by connecting the contact portions 32 to the contact portion 33 by the wiring layer M1, the floating diffusion 15 is electrically connected to the gate electrode 22 of the amplification transistor Tr3.

In the fabrication method described above, when the floating diffusion 15 is desired to be connected to the gate electrode 22 of the amplification transistor Tr3 using the light-shielding film 24 as in the case illustrated in FIG. 6, an aperture is formed above the gate electrode 22 in the process illustrated in FIG. 8D. Then, the aperture provided above the gate electrode 22 is filled with tungsten so that the contact portion 36 is formed. In this case, the light-shielding film 24 is formed so as to extend above the contact region 36 in the process illustrated in FIG. 8E. Thus, the floating diffusion 15 and the gate electrode 22 of the amplification transistor Tr3 are electrically connected to each other.

In the present embodiment, the processes of forming the photodetector 14, floating diffusion 15, and the impurity regions 17 to 19 are performed after the gate electrodes 20 to 23 are formed. However, the sequence of the processes may be modified in various ways, and the photodetector 14, floating diffusion 15, and the impurity regions 17 to 19 may be formed before the formation of the gate electrodes 20 to 23. Further, in the embodiment described above, the vertical signal line VSL formed in the multi-wiring layer 29 is connected to the impurity region 19 of the selection transistor Tr4 by the contact portion 26. The other wires in the wiring layers, i.e., M1, M2, and M3, may be connected to desired region through contact portions formed by processes similar to those described above.

The solid-state imaging device 1 is fabricated through the above processes.

According to the solid-state imaging device 1 of the present embodiment, the light-shielding film 24 for shielding the floating diffusion 15 from light is formed in a layer lower than the multi-wiring layer 29. As a result, the distance between the upper surface of the substrate 13 and the light-shielding film 24 is decreased. This makes it possible to suppress leakage of light from an interlayer film such as the insulating layer formed between the floating diffusion and the light-shielding film 42 into the floating diffusion 15. Consequently, noise due light incident onto the floating diffusion 15 during transfer of signal charge from the photodetector 14 to the floating diffusion 15 can be suppressed, which improves image quality.

Further, according to the solid-state imaging device 1 of the present embodiment, parasitic capacitance occurs between the floating diffusion 15 and the light-shielding film 24. This indicates that the use of light-shielding film 24 can increase saturation charge in the floating diffusion 15.

Moreover, according to the related art, when a wiring layer of the multi-wiring layer 29 (e.g., the wiring layer M1) is used for forming a light-shielding film, both a wiring region used for light-shielding and a wiring region for other wiring are both necessary. That is, according to the related art, it is necessary to provide a number of wiring regions in the same layer. However, according to the solid-state imaging device 1 in the present embodiment, the light-shielding film 24 is constituted by the bottom wiring layer M0 provided in a layer lower than the multi-wiring layer 29. Thus, it is not necessary to fabricate a wire used for light-shielding in the wiring layers M1 to M3 of the multi-wiring layer 29. As a result, the size of the area occupied by the wiring layers M1 to M3 in the multi-wiring layer 29 is reduced, permitting an increase in size of the aperture of the photodiode 14. Accordingly, the quantity of light incident onto the photodiode 14 can be increased in each of the pixels 2.

According to a recently developed technique, a CMOS solid-state imaging device having a global shutter function (simultaneous shutter function) may employ a drive system in which signal charge is stored in a floating diffusion for a long period of time. In such a CMOS solid-state imaging device, signal charge generated by simultaneous exposure of all pixels is simultaneously transferred to the floating diffusion and then line-sequentially output to the vertical signal lines VSL. In this case, the signal charge stored in the floating diffusion is not transferred immediately to a vertical signal line, light leaked into the floating diffusion causes significant degradation of image quality. Even in a case where signal charge is stored in the floating diffusion for a short period of time, incidence of high-luminance light on the floating diffusion results in degradation of image quality.

According to the solid-state imaging device 1 in the present embodiment, leakage of light into the floating diffusion 15 can be suppressed by the effect of the light-shielding film 24, compared to a solid-state imaging device according to the related art. Thus, the present embodiment can be advantageously applied to fabrication of a solid-state imaging device having a global shutter function, in which leakage of light into a floating diffusion significantly affects image quality due to a long storage period of signal charge in the floating diffusion. Further, the solid-state imaging device 1 can suppress degradation of image quality due to incidence of high-luminance light into the floating diffusion 15.

In the above embodiment, the bottom wiring layer M0 disposed in a layer lower than the multi-wiring layer 29 is used as the light-shielding film 24 in the pixel section 3. The bottom wiring layer M0 may be used for the pixel section 3 as well as used for both the pixel section 3 and the peripheral circuit region 12.

When the bottom wiring layer M0 constituting the light-shielding film 24 is used only for forming the pixel section 3, the peripheral circuit region 12 having a general configuration can be used. In general, in the peripheral circuit region 12, a basic layout is prepared for each basic component such as an inverter, NAND, and NOR, and these components are fabricated in the multi-wiring layer 29. Therefore, when the bottom wiring layer M0 constitutes only the pixel section 3, the peripheral circuit region 12 can be fabricated by employing processes according to the related art. In particular, when the bottom wiring layer M0 constitutes the peripheral circuit region 12, a signal delay or the like may occur due to an increase in parasitic capacitance associated with other wiring layers. If such a delay is concerned, the bottom wiring layer M0 may be used only for fabricating the pixel section 3.

Moreover, a CMOS solid-state imaging device may be provided with various analog circuits and A/D (analog/digital) converters mounted on the same chip. Such circuits include nodes and elements such as an S/H (sample and hold) capacitor which are electrically floating similarly to a floating diffusion. It is desirable that these nodes and elements be sufficiently shielded from light. According to the solid-state imaging device 1 in the present embodiment, it is possible to shield the nodes and elements in the peripheral circuit region 12 from light by using the bottom wiring layer M0 as a light-shielding film constituted by the bottom wiring layer M0. Thus, the solid-state imaging device 1 can also improve the light-shielding property even when the bottom wiring layer M0 is also used as a light-shielding film for the peripheral circuit region 12.

Further, the bottom wiring layer M0 constituting the light-shielding film 24 may also be used as a wire in the peripheral circuit region 12. In this case, the bottom wiring layer M0 is used as wires in individual blocks, which can increase the degree of integration of the individual blocks. Accordingly, the size of each block can be reduced, and thus size reduction of the solid-state imaging device 1 can be realized.

2. Second Embodiment: Solid-State Imaging Device

Figure 10:
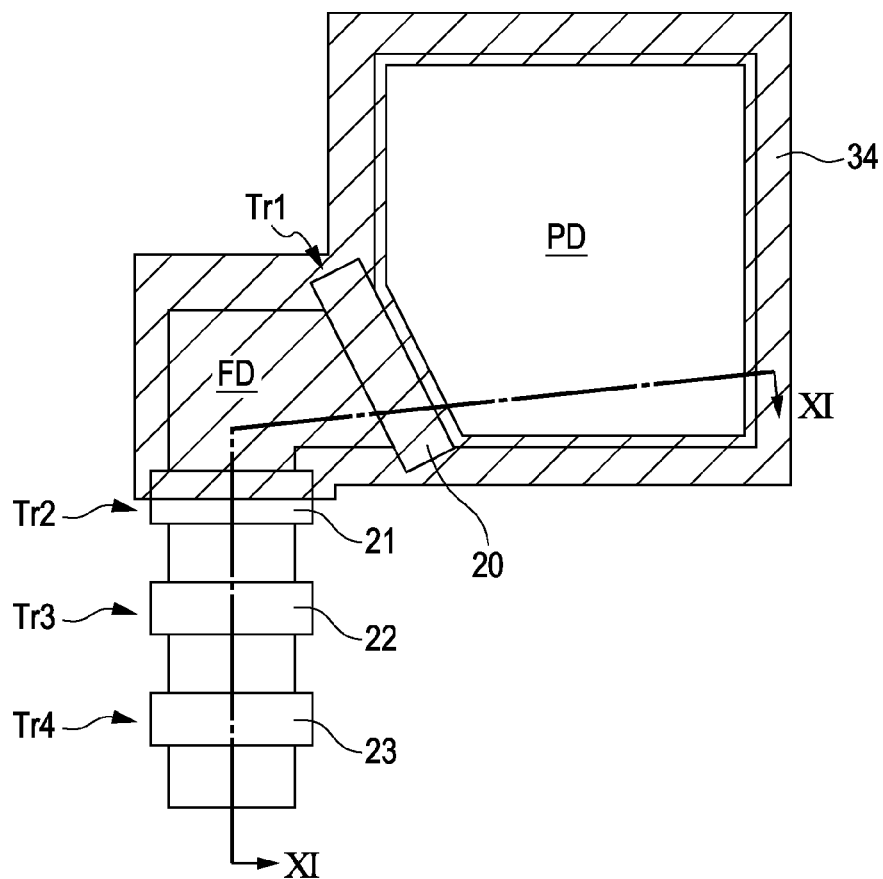
FIG. 10 is a plan view illustrating a single pixel according to a second embodiment of the present invention.
Figure 11:
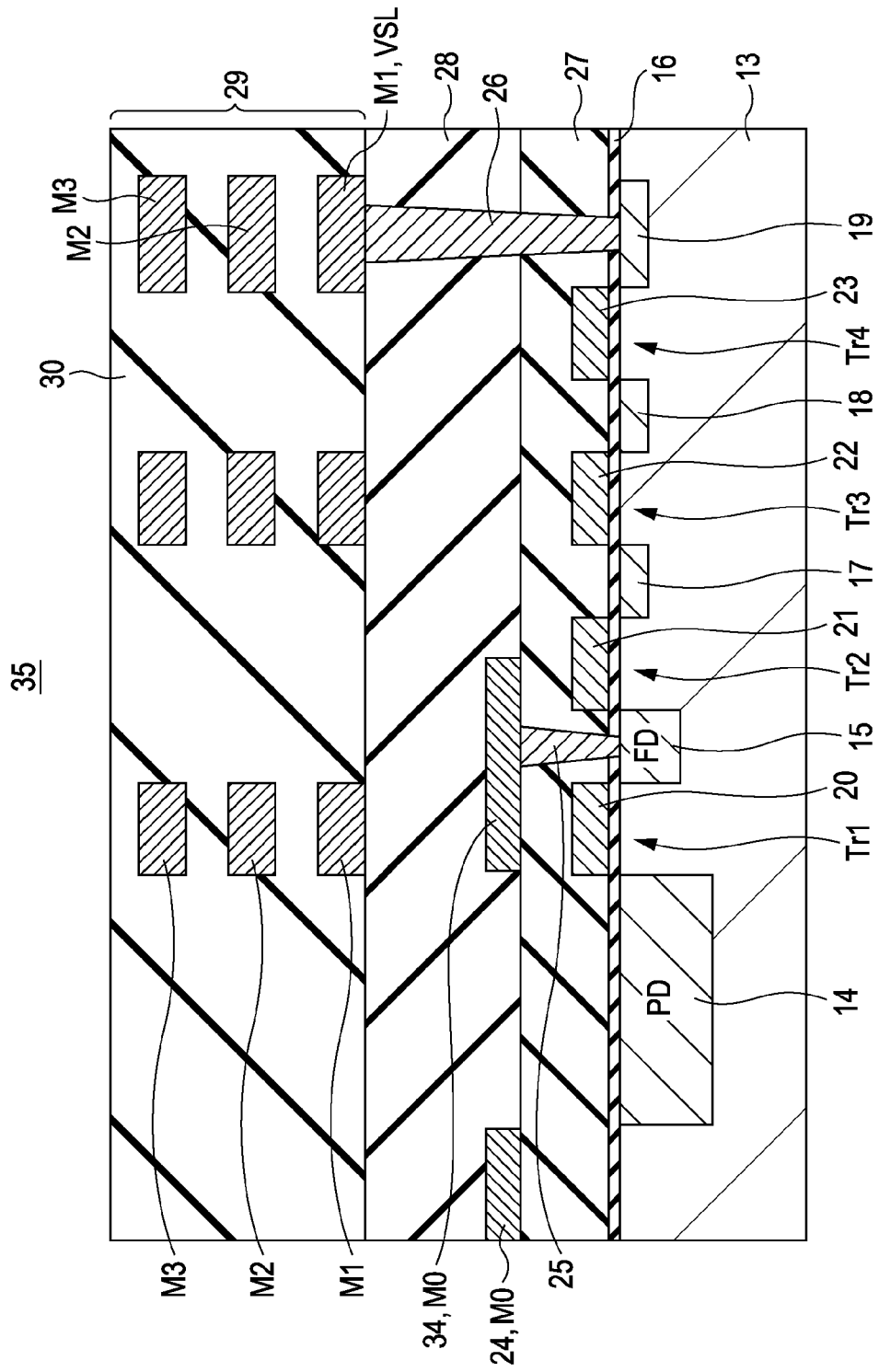
FIG. 11 is a cross-sectional view taken along line XI-XI' in FIG. 10.

In the following, a solid-state imaging device according to a second embodiment of the present invention will be described. FIG. 10 is a plan view illustrating a single pixel in the solid-state imaging device 35 according to the second embodiment of the present invention. FIG. 11 is a cross sectional view taken along line XI-XI'. The overall configuration of the solid-state imaging device 35 in the present embodiment is similar to that of the solid-state imaging device 1 illustrated in FIG. 1, and the description thereof will be omitted. The solid-state imaging device 35 in the present embodiment has pixels 2 configured similarly to the pixels 2 in the first embodiment illustrated in FIG. 4, and thus the description thereof will be omitted. In FIG. 10 and FIG. 11, the same reference numerals are used to refer to the same or corresponding components as those shown in FIG. 2 and FIG. 3, respectively, and the description of the components will be omitted.

The solid-state imaging device 35 according to the present embodiment includes a light-shielding film 34 which is an example of a modification of the light-shielding film 24 in the solid-state imaging device 1 according to the first embodiment.

In the solid-state imaging device 35 in the present embodiment, as illustrated in FIG. 10, the light-shielding film 34 extends from a region covering a floating diffusion 15 to a region around a photodetector 14 except for a region directly above the aperture of the photodetector 14. In the present embodiment, the portion of the light-shielding film 34 covering the floating diffusion 15 is electrically connected to the portion of the light-shielding film 34 around the photodetector 14. However, these portions may be separated from each other.

In the solid-state imaging device 35 in the present embodiment, the floating diffusion 15 and a gate electrode 22 of an amplification transistor Tr3 are electrically connected to each other in the same manner as the example shown in FIG. 5 or FIG. 6.

To fabricate the solid-state imaging device 35 according to the present embodiment, a bottom wiring layer M0 is patterned so that the light-shielding film 34 extends around the photodetector 14 in the process illustrated in FIG. 8E in the first embodiment.

In the solid-state imaging device 35, the light-shielding film 34 is formed in a layer lower than a multi-wiring layer 29, so that the light-shielding film 34 formed around the photodetector 14 is less distant from the substrate 13. This arrangement prevents mixing of light incident on neighboring pixels. For example, light which has passed through a red color filter of one of the pixels 2 can be prevented from traveling into the photodetector 14 constituting an adjacent one of the pixels 2 having a green color filter. Accordingly, mixing of colors can be avoided, and thus the image quality can be improved.

In the present embodiment, besides the above effect, similar effects and advantages to those in the first embodiment can be obtained.

3. Third Embodiment: Solid-State Imaging Device

In the following, a solid-state imaging device according to a third embodiment of the present invention will be described.

Figure 12:
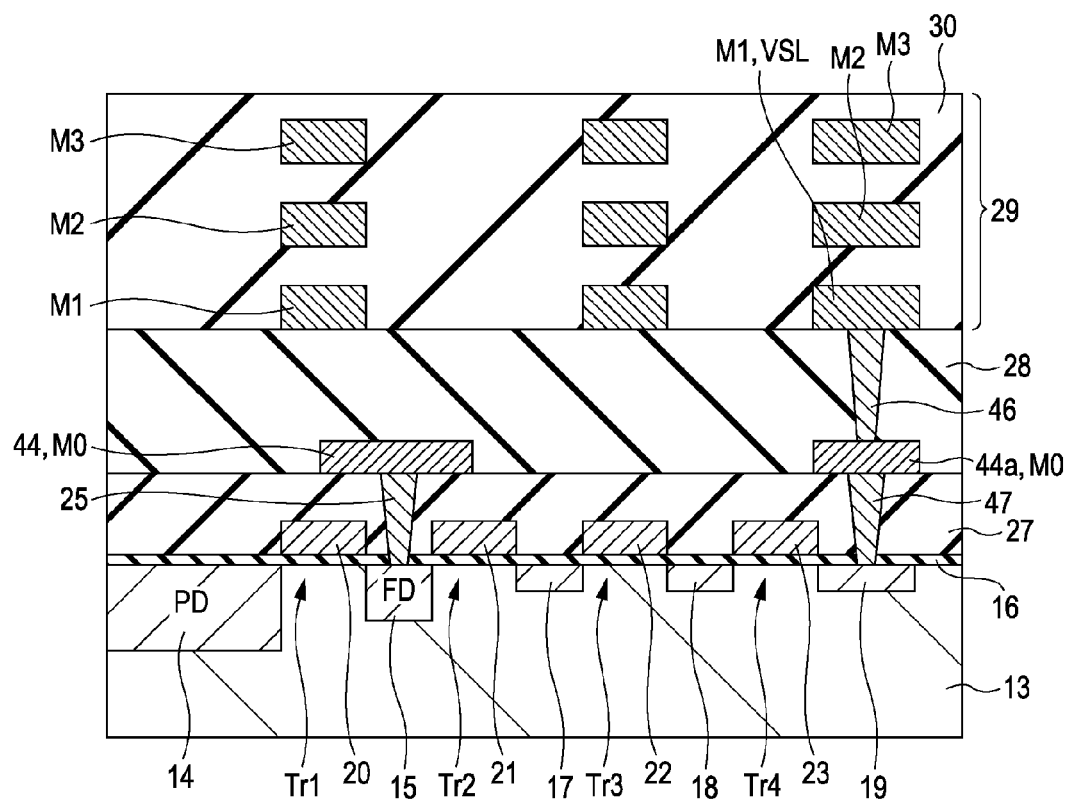
FIG. 12 is a schematic cross-sectional view illustrating a solid-state imaging device according to a third embodiment of the present invention.

FIG. 12 is a schematic cross-sectional view of a solid-state imaging device 45 according to the third embodiment of the present invention. The overall configuration of the solid-state imaging device 45 is similar to that of the solid-state imaging device 1 in the first embodiment illustrated in FIG. 1, and thus the description thereof will be omitted. In addition, in the solid-state imaging device 45, the planar layout and circuit configuration of a single pixel are similar to those in the first embodiment illustrated in FIG. 2 and FIG. 4, and the description thereof will be omitted. In FIG. 12, the same reference numerals are used to refer to the same or corresponding components as those shown in FIG. 3, and the description of the components will be omitted.

[3.1 Configurations of Main Components]

In the solid-state imaging device 45 according to the present embodiment, an impurity region 19 constituting the drain of a selection transistor Tr4 is connected to a vertical signal line VSL via an intermediate film 44a constituted by a bottom wiring layer M0. That is, the vertical signal line VSL and the impurity region 19 are electrically connected via a first contact portion 47 formed in a first insulating layer 27, the intermediate film 44a, and a second contact portion 46 formed in a second insulating layer 28.

[3.2 Fabrication Method of Solid-State Imaging Device]

Figure 13A:
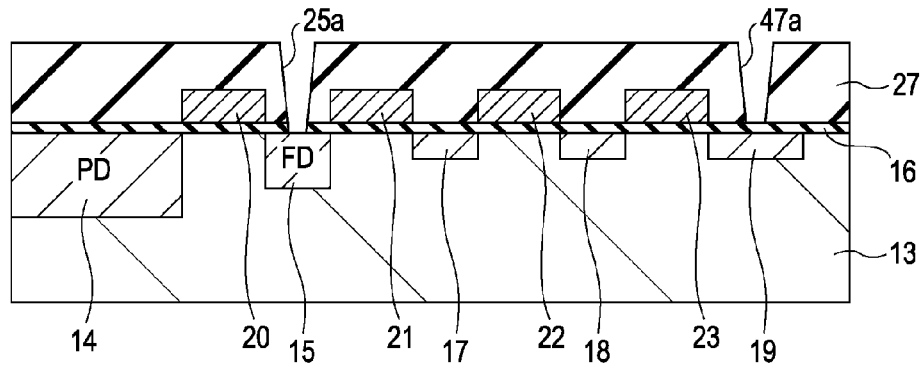
FIGS. 13A to 13C illustrate processes of fabricating a solid-state imaging device according to the third embodiment of the present invention.
Figure 13B:
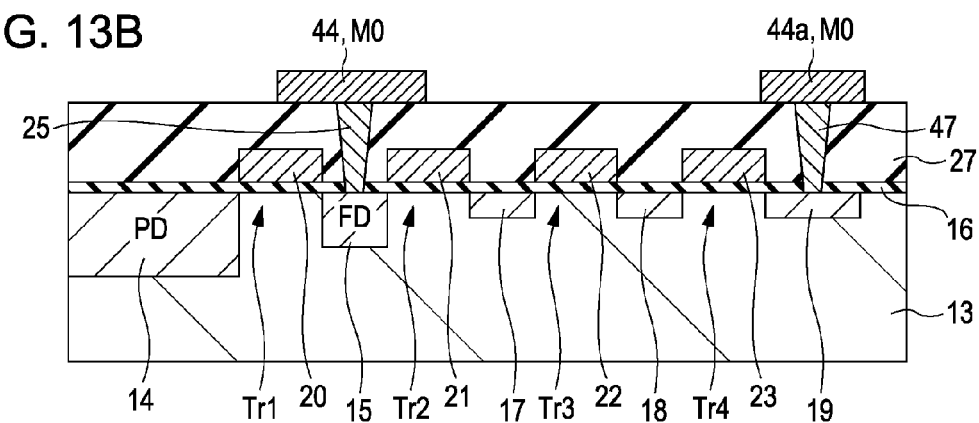
Figure 13C:
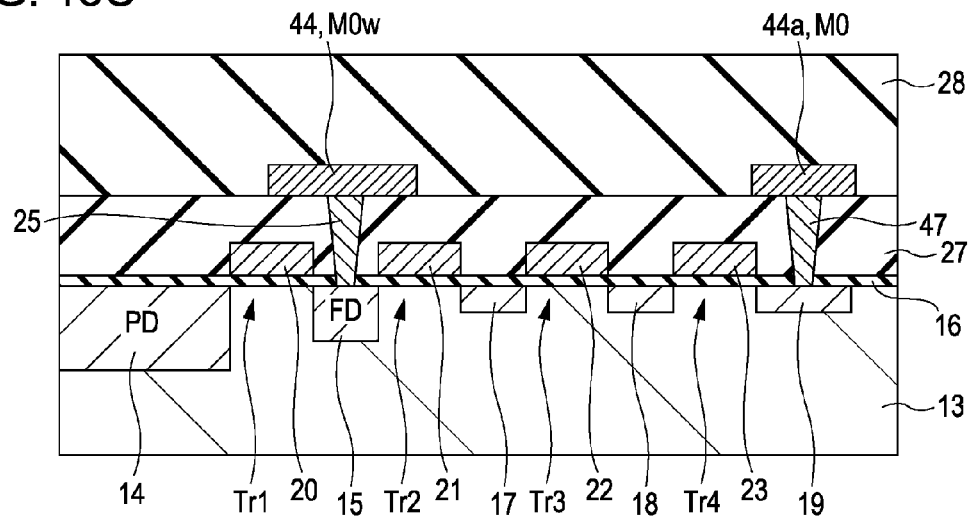
Figure 14D:
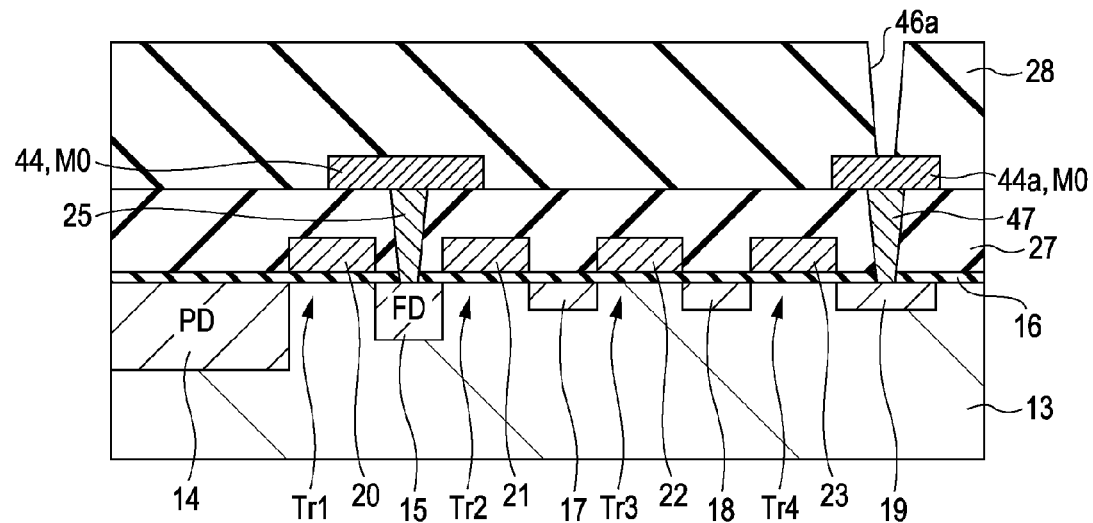
FIGS. 14D and 14E illustrate processes of fabricating a solid-state imaging device according to the third embodiment of the present invention.
Figure 14E:
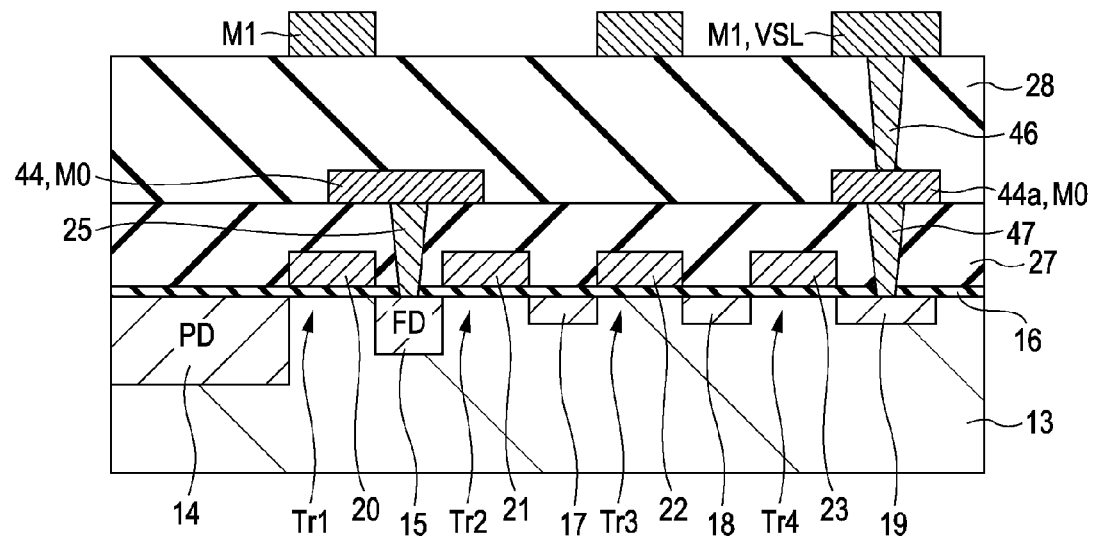

Referring to FIG. 13A and FIG. 14E, a method for fabricating the solid-state imaging device 45 according to the present embodiment will be described. FIG. 13A to FIG. 14E illustrate individual processes in the fabrication method of the solid-state imaging device 45.

The processes to be performed prior to the process illustrated in FIG. 13A are similar to the processes in the first embodiment illustrated in FIGS. 7A to 7C, and thus description thereof will be omitted.

After the first insulating layer 27 is formed as illustrated in FIG. 7C, an aperture 25a is formed through a gate insulating film 16 and the first insulating layer 27 so that a floating diffusion 15 is exposed, as illustrated in FIG. 13A. At the same time, an aperture 47a is formed through the gate insulating film 16 and the first insulating layer 27 so that the impurity region 19 constituting the selection transistor Tr4 is exposed.

Then, as illustrated in FIG. 13B, the aperture 25a formed above the floating diffusion 15 is filled with tungsten so that a contact portion 25 is formed. At the same time, the aperture 47a formed above the impurity region 19 is filled with tungsten so that the first contact portion 47 is formed. Then, the bottom wiring layer M0 made of tungsten is formed on the first insulating layer 27 at a region covering the floating diffusion 15 and a region including the first contact portion 47. The bottom wiring layer M0 formed at a region which covers the floating diffusion 15 is used as a light-shielding film 44, and the bottom wiring layer M0 formed at a region including the first contact portion 47 on the first insulating layer 27 is used as the intermediate film 44a. The light-shielding film 44 and the intermediate film 44a are formed by patterning a tungsten metal film formed on the entire upper surface of the first insulating layer 27. It is desirable that the region occupied by light-shielding film 44 on the first insulating layer 27 be larger than the upper surface of the floating diffusion 15. This arrangement improves the light shielding effect for light incident from various angles.

Subsequently, as illustrated in FIG. 13C, a second insulating layer 28 is further formed on the first insulating layer 27 including the light-shielding film 44 and the intermediate film 44a.

Then, as illustrated in FIG. 14D, an aperture 46a is formed in the second insulating layer 28 so that the intermediate film 44a is exposed.

Further, as illustrated in FIG. 14B, the aperture 46a is filled with tungsten so that a second contact portion 46 is formed. At the same time, a wiring layer M1 made of aluminum or copper is formed at a predetermined position on the second insulating layer 28 including the second contact portion 46. In the example illustrated in FIG. 14E, the wiring layer M1, which is connected to the impurity region 19 via the first contact portion 47, the intermediate film 44a, and the second contact portion 46, constitutes a vertical signal line VSL.

Then, an interlayer insulating film 30 and wiring layers are alternatively formed, so that a multi-wiring layer 29 having a plurality of wiring layers (three wiring layers M1, M2, and M3 in the present embodiment) is formed.

Subsequently, although not illustrated in the drawings, a planarizing film, a color filter layer, an on-chip microlens, and so forth are formed, using a general fabrication method of a solid-state imaging device, and thus the fabrication of the solid-state imaging device 45 is completed.

In the process (illustrated in FIG. 9G) according to the fabrication method in the first embodiment, in forming an aperture having a depth equal to the combined thicknesses of the first insulating layer 27 and the second insulating layer 28, there is a problem in that the diameter of the aperture increases with increasing depth of the aperture.

According to a fabrication method of a solid-state imaging device in the present embodiment, the contact portion connecting the wiring layer M1 in the multi-wiring layer 29 (vertical signal line VSL in the present embodiment) to a desired region formed on the substrate 13 (the impurity region 19 in the present embodiment) is formed in two steps. As a result, each of the apertures 47a and 46a which is formed in a single step can have a reduced depth. Thus, according to the present embodiment, it is possible to form the apertures 47a and 46a in insulating layers each having a small thickness, and thus to reduce the aspect ratio of each of the apertures 47a and 46a. Consequently, the first contact portion 47 and the second contact portion 46 can be formed to be very small compared to the fabrication method according to the first embodiment, which permits reduction of pixel size. When the fabrication method according to the present embodiment is employed without attempting to reduce the pixel size, the degree of integration of each element can be increased, which permits an increase in size of the aperture of the photodetector 14.

In the present embodiment, the wiring layer M1 connected to the substrate 13 constitutes a vertical signal line VSL. The size of each contact portion can be further reduced by forming a contact portion, for example, connecting a gate electrode to a wire in the multi-wiring layer in a similar manner to the above example.

In the solid-state imaging device 45 according to the present embodiment, similar effects to those in the first embodiment can be achieved.

The fabrication method of a solid-state imaging device according to the present embodiment can be applied to a solid-state imaging device according to the second embodiment.

4. Fourth Embodiment: Solid-State Imaging Device

Figure 15A:
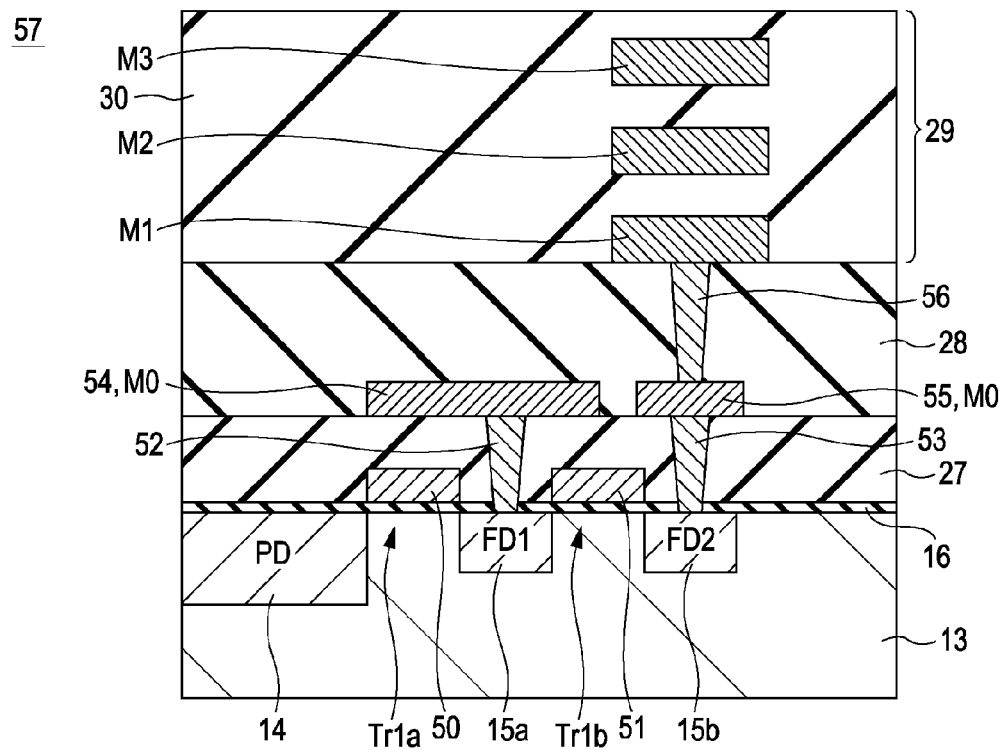
FIGS. 15A and 15B are schematic cross-sectional views each illustrating a configuration a solid-state imaging device according to a fourth embodiment of the present invention.

In the following, a solid-state imaging device according to the fourth embodiment of the present invention will be described. FIG. 15A is a cross-sectional view schematically illustrating a configuration of a solid-state imaging device 57 according to the fourth embodiment. The overall configuration of the solid-state imaging device 57 in the present embodiment is similar to that of the solid-state imaging device 1 illustrated in FIG. 1, and the description thereof will be omitted. In FIG. 15A, the same reference numerals are used to refer to the same or corresponding components as those illustrated in FIG. 3, and the description of the components will be omitted. The solid-state imaging device 57 has a global shutter function, in which all pixels are simultaneously exposed (signal charge is simultaneously stored), and includes two floating diffusions.

The solid-state imaging device 57 includes a photodetector 14 formed on the upper side of a substrate 13, a first floating diffusion 15a and a second floating diffusion 15b.

A gate electrode 50 constituting a first transfer transistor Tr1a is disposed between the photodetector 14 and the first floating diffusion 15a on a gate insulating film 16 formed on the upper surface of the substrate 13. A gate electrode 51 constituting a second transfer transistor Tr1b is disposed between the first floating diffusion 15a and the second floating diffusion 15b on the gate insulating layer 16 on the substrate 13.

Although not illustrated in FIG. 15A, also in the present embodiment, a reset transistor, an amplification transistor, a selection transistor, and the like are provided, as in the cases of the first to third embodiments.

A first insulating layer 27 is formed on the gate insulating film 16 including the gate electrodes 50 and 51. A light-shielding film 54 constituted by a bottom wiring layer M0 is formed on the first insulating layer 27 at a region including a region directly above the first floating diffusion 15a. Similarly, light-shielding film 55 constituted by the bottom wiring layer M0 is formed on the first insulating layer 27 at a region including a region directly above the second floating diffusion 15b. The light-shielding film 54 is electrically connected to the first floating diffusion 15a via a contact portion 52 formed in the first insulating layer 27. The light-shielding film 55 is electrically connected to the second floating diffusion 15b via a contact portion 53 formed in the first insulating layer 27. In the present embodiment, the light-shielding films 54 and 55 and the contact portions 52 and 53 are made of tungsten.

A second insulating layer 28 is formed on the first insulating layer 27 including the light-shielding films 54 and 55. Further, a multi-wiring layer 29 containing a plurality of wiring layers (three wiring layers M1, M2, and M3 in the present embodiment) is formed on the second insulating layer 28. The wiring layer M1 located at the lowest position among the wiring layers in the multi-wiring layer 29 is electrically connected to the light-shielding film 55 by a contact portion 56 formed in the second insulating layer 28. Although not shown in the figure, the wiring layer M1 electrically connected to the second floating diffusion 15b is connected to the gate electrode of the amplification transistor.

In the solid-state imaging device 57 having the above configuration, signal charge generated in the photodetector 14 of every one of pixels 2 by simultaneous exposure is transferred by the first transfer transistor Tr1a to the first floating diffusion 15a at the same time. Then, after being held in the first floating diffusion 15a for a predetermined period of time, the signal charge is transferred by the second transfer transistor Tr1b pixel by pixel to the second floating diffusion 15b. A voltage variation caused by the signal charge transferred to the second floating diffusion 15b is amplified by the amplification transistor (not shown), and an amplified pixel signal is output to a vertical signal line.

In the solid-state imaging device 57 in the present embodiment, the first floating diffusion 15a, which holds signal charge for a long time, is shielded from light by the light-shielding film 54 constituted by the bottom wiring layer M0 disposed close to the light receiving surface of the substrate 13. This arrangement can prevent leakage of incident light into the floating diffusion 15a even while signal charge is held in the first floating diffusion 15a, which can suppress noise and degradation of image quality.

In addition, the light-shielding film 54 disposed above the first floating diffusion 15a is electrically connected to the first floating diffusion 15a. Therefore, by increasing the size of the light-shielding film 54, saturation charge in the first floating diffusion 15a can be increased using parasitic capacitance of the light-shielding film 54.

On the other hand, in the solid-state imaging device 57 according to the present embodiment, the light-shielding film 55 disposed above the second floating diffusion 15b is connected to the wiring layer M1 in the multi-wiring layer 29. Thus, it is desired that parasitic capacitance between the light-shielding film 55 and the wiring layer M1 be small. Therefore, it is desired that the light-shielding film 55 has a size that is only sufficient to shield the second floating diffusion 15b from light.

Figure 15B:
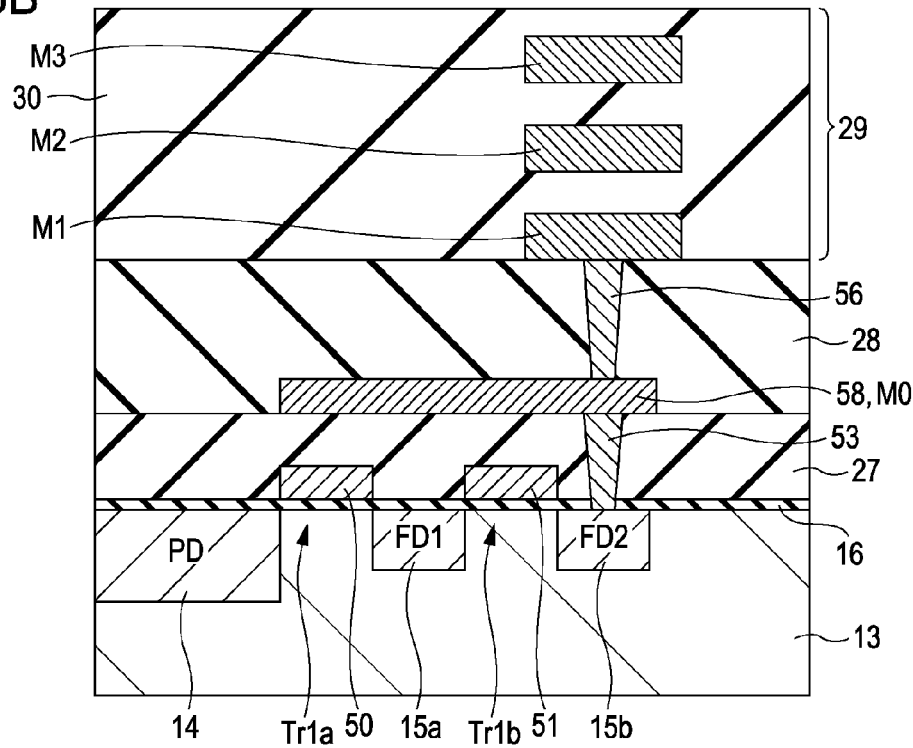

Meanwhile, in the present embodiment, it is not necessary to connect the light-shielding film 54 disposed above the first floating diffusion 15a to the first floating diffusion 15a. In this case, as illustrated in FIG. 15B, a light-shielding film 58 for shielding both the first floating diffusion 15a and the second floating diffusion 15b is formed of the bottom wiring layer M0 above the floating diffusions 15a and 15b. Thus, when two floating diffusions are provided, contact portions are formed at only a location to be connected to a gate electrode of the amplification transistor.

In this way, according to the present embodiment, light leakage into a floating diffusion can be prevented even in a solid-state imaging device having a global shutter function, in which the floating diffusion holds signal charge for a long period of time.

Also in the present embodiment, similar effect to those in the first embodiment can be achieved. In addition, the configuration in the present embodiment may be combined with those in the second and third embodiments.

In the foregoing, CMOS solid-state imaging devices including pixel units arranged in matrix for detecting signal charge corresponding to the quantity of incident light as a physical quantity are described as examples of the first to fourth embodiments. However, application of the present invention is neither limited to CMOS solid-state imaging devices nor to solid-state imaging devices in general including column circuits for individual pixel columns in a pixel section formed in two-dimensional matrix.

Further, application of the present invention is not limited to a solid-state imaging device configured to capture an image by detecting a distribution of the quantity of incident visible light. The present invention may also be applied to solid-state imaging device configured to detect a distribution of the quantity of infrared radiation, X-rays, or particles. In a broader sense, the present invention may also be applied to solid-state imaging devices (physical quantity distribution detectors) in general, such as fingerprint sensors, which are configured to detect distributions of physical quantities such as pressure and capacitance so as to capture images.

Moreover, the application of the present invention is not limited to a solid-state imaging device configured to sequentially scan pixel units in pixel sections in units of rows so as to read pixel signals from the pixel units. The present invention may also be applied to an X-Y address solid-state imaging device configured to select arbitrary pixels and read signals from the selected pixels on a pixel-by-pixel basis.

A solid-state imaging device according to an embodiment of the present invention may be formed as one chip or in a form of a module having an image capturing function in which a signal processing unit and an optical system are packaged.

Furthermore, application of the present invention is not limited to a solid-state imaging device, and the present invention may be applied to imaging apparatuses. Such imaging apparatus include camera systems such as digital still cameras and electronic apparatuses having imaging functions such as mobile phones. Modules mounted in the electronic apparatuses, i.e., camera modules, may also serve as imaging apparatuses.

5. Fifth Embodiment: Electronic Apparatus

Figure 16:
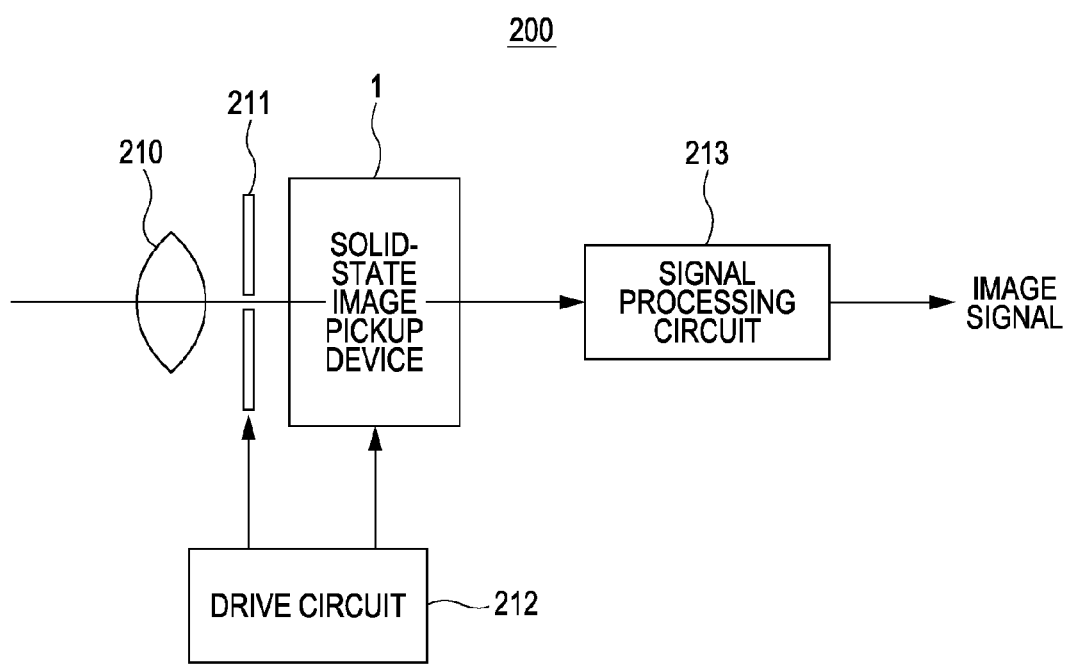
FIG. 16 schematically illustrates a configuration of an electronic apparatus according to a fifth embodiment of the present invention.

In the following, an electronic apparatus according to the fifth embodiment of the present invention will be described. FIG. 16 schematically illustrates a configuration of an electronic apparatus 200 according to the fifth embodiment of the present invention.

The electronic apparatus 200 is an example of an electronic apparatus (camera) to which the solid-state imaging device 1 according to the first embodiment described above is applied.

FIG. 16 schematically illustrates a cross-sectional configuration of the electronic apparatus 200 according to the present embodiment. The electronic apparatus 200 may be a digital camera capable of capturing a still image.

The electronic apparatus 200 includes the solid-state imaging device 1, an optical lens 210, a shutter 211, a drive circuit 212, and a signal processing circuit 213.

The optical lens 210 forms an image corresponding to incident light from an imaging object on an imaging plane of the solid-state imaging device 1. As a result, signal charge is stored in the solid-state imaging device 1 for a predetermined period of time.

The shutter 211 controls an exposure time and a light-shielding time of the solid-state imaging device 1.

The drive circuit 212 supplies a drive signal for controlling transfer operations of the solid-state imaging device 1 and shutter operations of the shutter 211. The solid-state imaging device 1 transfers signals in accordance with drive signals (timing signals) supplied from the drive circuit 212. The signal processing circuit 213 performs various signal processing. A processed image signal is stored in a storage medium such as a memory or output to a monitor.

In the electronic apparatus 200 in the present embodiment, floating diffusions of the solid-state imaging device 1 are advantageously shielded from light by light-shielding films constituted by bottom wiring layers, so that leakage of light into the floating diffusions are suppressed. Thus, the electronic apparatus 200 can suppress degradation of image quality due to noise.

The electronic apparatus 200 to which the solid-state imaging device 1 can be applied is not limited to a camera. The electronic apparatus 200 may also be an imaging apparatus such as a digital still camera and a camera module for a mobile device such as a mobile phone.

While in the present embodiment, the solid-state imaging device 1 is applied to the electronic apparatus 200, the solid-state imaging devices according to the second to fourth embodiments described above may also be applied to the electronic apparatus 200.

The present application contains subject matter related to that disclosed in Japanese Priority Patent Application JP 2009-052324 filed in the Japan Patent Office on Mar. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a photodetector on a substrate, the photodetector configured to generate a signal charge by converting incident light into the signal charge;
a floating diffusion region configured to receive the signal charge generated by the photodetector;
a plurality of metal oxide semiconductor transistors including a transfer transistor that transfers the signal charge to the floating diffusion region and an amplification transistor that outputs a pixel signal corresponding to a potential of the floating diffusion region;
a multi-wiring layer in a layer carried on the substrate, the multi-wiring layer composed of a plurality of wiring layers electrically connected to the metal oxide semiconductor transistors via contact portions; and
a light-shielding film constituted by a bottom wiring layer that is disposed between the substrate and the multi-wiring layer, the light-shielding film (a) being over the floating diffusion region to shield the floating diffusion region from the light such that the light-shielding film extends from a region over the floating diffusion region to a region surrounding the photodetector except for a region directly above an aperture of the photodetector, (b) electrically connected to the floating diffusion region via a first contact portion, and (c) electrically connected to a gate electrode of the amplification transistor via a second contact portion,
wherein,
each of the MOS transistors are electrically connected to the wiring layers in the multi-wiring layer by contact portions via an intermediate film constituted by the bottom wiring layer.

2. The solid-state imaging device according to claim 1, wherein the light-shielding film is formed so as to surround the photodetector except in a region directly above an aperture of the photodetector.

3. A method for fabricating a solid-state imaging device, the method comprising the steps of:
forming a photodetector, a floating diffusion region, and an impurity region on a substrate, the impurity region constituting a predetermined source or drain of a MOS transistor;
forming an aperture to expose the floating diffusion region and the impurity region by removing respective portions of the first insulating layer above the floating diffusion region and the impurity region;
forming a contact portion by filling the aperture in the first insulating layer and the impurity region with a metallic material;
forming a light-shielding layer constituted by a bottom wiring layer at a region on the first insulating layer including the contact portion, the region configured to shield the floating diffusion region from light;
forming an intermediate film constituted by the bottom wiring layer on the first insulating layer including the contact portion on the impurity region;
forming a second insulating layer on the first insulating layer including the light-shielding film and the intermediate film;
forming an aperture in the second insulating layer so that the intermediate film is exposed by removing a respective portion of the second insulating layer;
forming a contact portion by filling the aperture in the second insulating layer with a metallic material; and
forming a multi-wiring layer having a plurality of wiring layers including a wire connected to the contact portion in the second insulating layer.

4. The method of claim 3, further comprising the step of forming the light-shielding film so as to surround the photodetector except in a region directly above the aperture of the photodiode.

5. An electronic apparatus comprising:
an optical lens;
solid-state imaging device comprising (a) a photodetector on a substrate, the photodetector configured to generate a signal charge by converting incident light into the signal charge, (b) a floating diffusion region configured to receive the signal charge generated by the photodetector, (c) a plurality of metal oxide semiconductor transistors including a transfer transistor that transfers the signal charge to the floating diffusion region and an amplification transistor that outputs a pixel signal corresponding to a potential of the floating diffusion region, (d) a multi-wiring layer in a layer carried on the substrate, the multi-wiring layer composed of a plurality of wiring layers electrically connected to the metal oxide semiconductor transistors via contact portions, and (e) a light-shielding film constituted by a bottom wiring layer that is disposed between the substrate and the multi-wiring layer, the light-shielding film (i) being over the floating diffusion region to shield the floating diffusion region from the light such that the light-shielding film extends from a region over the floating diffusion region to a region surrounding the photodetector except for a region directly above an aperture of the photodetector, (ii) electrically connected to the floating diffusion region via a first contact portion, and (iii) electrically connected to a gate electrode of the amplification transistor via a second contact portion; and
a signal processing circuit configured to process a signal output from the solid-state imaging device,
wherein,
each of the MOS transistors are electrically connected to the wiring layers in the multi-wiring layer by contact portions via an intermediate film constituted by the bottom wiring layer.

6. The electronic apparatus according to claim 5, wherein the light-shielding film is formed so as to surround the photodetector except in a region directly above an aperture of the photodetector.

* * * * *